(12) United States Patent
Salter et al.

(10) Patent No.: US 9,641,172 B2
(45) Date of Patent: May 2, 2017

(54) PROXIMITY SWITCH ASSEMBLY HAVING VARYING SIZE ELECTRODE FINGERS

(75) Inventors: Stuart C. Salter, White Lake, MI (US); Pietro Buttolo, Dearborn Heights, MI (US); Jeffrey Singer, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 739 days.

(21) Appl. No.: 13/534,126

(22) Filed: Jun. 27, 2012

(65) Prior Publication Data
US 2014/0002405 A1    Jan. 2, 2014

(51) Int. Cl.
*G06F 3/044*    (2006.01)
*H03K 17/96*    (2006.01)

(52) U.S. Cl.
CPC ... *H03K 17/962* (2013.01); *H03K 2017/9602* (2013.01)

(58) Field of Classification Search
USPC ........................................ 345/174
See application file for complete search history.

(56) References Cited

U.S. PATENT DOCUMENTS

| | | |
|---|---|---|
| 3,382,588 A | 5/1968 | Serrell et al. |
| 3,544,804 A | 12/1970 | Gaumer et al. |
| 3,691,396 A | 9/1972 | Hinrichs |
| 3,707,671 A | 12/1972 | Morrow et al. |
| 3,826,979 A | 7/1974 | Steinmann |
| 4,204,204 A | 5/1980 | Pitstick |
| 4,205,325 A | 5/1980 | Haygood et al. |
| 4,232,289 A | 11/1980 | Daniel |
| 4,257,117 A | 3/1981 | Besson |
| 4,290,052 A | 9/1981 | Eichelberger et al. |
| 4,340,813 A | 7/1982 | Sauer |
| 4,374,381 A | 2/1983 | Ng et al. |
| 4,380,040 A | 4/1983 | Posset |
| 4,413,252 A | 11/1983 | Tyler et al. |
| 4,431,882 A | 2/1984 | Frame |
| 4,446,380 A | 5/1984 | Moriya et al. |
| 4,453,112 A | 6/1984 | Sauer et al. |
| 4,492,958 A | 1/1985 | Minami |

(Continued)

FOREIGN PATENT DOCUMENTS

| | | |
|---|---|---|
| DE | 4024052 A1 | 1/1992 |
| EP | 1152443 | 11/2001 |

(Continued)

OTHER PUBLICATIONS

"Touch SensorSAtmelDesigncorporation.GUide" by ATMEL, 10620 D-AT42-04/09, Revised Apr. 2009, 72 pages, Copyrighted 2008-2009 Atmel Corporation.*

(Continued)

*Primary Examiner* — Amare Mengistu
*Assistant Examiner* — Shawna Stepp Jones
(74) *Attorney, Agent, or Firm* — Vichit Chea; Price Heneveld LLP

(57) ABSTRACT

A proximity switch is provided having a sensing pad and a proximity sensor disposed near a perimeter of the sensing pad to generate an activation field proximate to the sensing pad. The proximity sensor includes a plurality of interdigitated electrode fingers having differing lengths and spacings. The switch may be integrally formed as a lamp and proximity switch assembly.

20 Claims, 4 Drawing Sheets

(56) References Cited

U.S. PATENT DOCUMENTS

| | | | |
|---|---|---|---|
| 4,494,105 A | 1/1985 | House |
| 4,502,726 A | 3/1985 | Adams |
| 4,514,817 A | 4/1985 | Pepper et al. |
| 4,613,802 A | 9/1986 | Kraus et al. |
| 4,680,429 A | 7/1987 | Murdock et al. |
| 4,743,895 A | 5/1988 | Alexander |
| 4,748,390 A | 5/1988 | Okushima et al. |
| 4,758,735 A | 7/1988 | Ingraham |
| 4,821,029 A | 4/1989 | Logan et al. |
| 4,855,550 A | 8/1989 | Schultz, Jr. |
| 4,872,485 A | 10/1989 | Laverty, Jr. |
| 4,899,138 A | 2/1990 | Araki et al. |
| 4,901,074 A | 2/1990 | Sinn et al. |
| 4,905,001 A | 2/1990 | Penner |
| 4,924,222 A | 5/1990 | Antikidis et al. |
| 4,972,070 A | 11/1990 | Laverty, Jr. |
| 5,025,516 A | 6/1991 | Wilson |
| 5,033,508 A | 7/1991 | Laverty, Jr. |
| 5,036,321 A | 7/1991 | Leach et al. |
| 5,063,306 A | 11/1991 | Edwards |
| 5,108,530 A | 4/1992 | Niebling, Jr. et al. |
| 5,153,590 A | 10/1992 | Charlier |
| 5,159,159 A | 10/1992 | Asher |
| 5,159,276 A | 10/1992 | Reddy, III |
| 5,177,341 A | 1/1993 | Balderson |
| 5,215,811 A | 6/1993 | Reafler et al. |
| 5,239,152 A | 8/1993 | Caldwell et al. |
| 5,270,710 A | 12/1993 | Gaultier et al. |
| 5,294,889 A | 3/1994 | Heep et al. |
| 5,329,239 A | 7/1994 | Kindermann et al. |
| 5,341,231 A | 8/1994 | Yamamoto et al. |
| 5,403,980 A | 4/1995 | Eckrich |
| 5,451,724 A | 9/1995 | Nakazawa et al. |
| 5,467,080 A | 11/1995 | Stoll et al. |
| 5,477,422 A | 12/1995 | Hooker et al. |
| 5,494,180 A | 2/1996 | Callahan |
| 5,512,836 A | 4/1996 | Chen et al. |
| 5,548,268 A | 8/1996 | Collins |
| 5,566,702 A | 10/1996 | Philipp |
| 5,572,205 A | 11/1996 | Caldwell et al. |
| 5,586,042 A | 12/1996 | Pisau et al. |
| 5,594,222 A | 1/1997 | Caldwell |
| 5,598,527 A | 1/1997 | Debrus et al. |
| 5,670,886 A | 9/1997 | Wolff et al. |
| 5,681,515 A | 10/1997 | Pratt et al. |
| 5,730,165 A | 3/1998 | Philipp |
| 5,747,756 A | 5/1998 | Boedecker |
| 5,760,554 A | 6/1998 | Bustamante |
| 5,790,107 A | 8/1998 | Kasser et al. |
| 5,796,183 A | 8/1998 | Hourmand |
| 5,825,352 A | 10/1998 | Bisset et al. |
| 5,827,980 A * | 10/1998 | Doemens et al. ....... 73/862.626 |
| 5,864,105 A | 1/1999 | Andrews |
| 5,867,111 A | 2/1999 | Caldwell et al. |
| 5,874,672 A | 2/1999 | Gerardi et al. |
| 5,917,165 A | 6/1999 | Platt et al. |
| 5,920,309 A | 7/1999 | Bisset et al. |
| 5,942,733 A | 8/1999 | Allen et al. |
| 5,963,000 A | 10/1999 | Tsutsumi et al. |
| 5,973,417 A | 10/1999 | Goetz et al. |
| 5,973,623 A | 10/1999 | Gupta et al. |
| 6,010,742 A | 1/2000 | Tanabe et al. |
| 6,011,602 A | 1/2000 | Miyashita et al. |
| 6,031,465 A | 2/2000 | Burgess |
| 6,035,180 A | 3/2000 | Kubes et al. |
| 6,037,930 A | 3/2000 | Wolfe et al. |
| 6,040,534 A | 3/2000 | Beukema |
| 6,157,372 A | 12/2000 | Blackburn et al. |
| 6,172,666 B1 | 1/2001 | Okura |
| 6,215,476 B1 | 4/2001 | Depew et al. |
| 6,219,253 B1 | 4/2001 | Green |
| 6,231,111 B1 | 5/2001 | Carter et al. |
| 6,275,644 B1 | 8/2001 | Domas et al. |
| 6,288,707 B1 | 9/2001 | Philipp |
| 6,292,100 B1 | 9/2001 | Dowling |
| 6,310,611 B1 | 10/2001 | Caldwell |
| 6,320,282 B1 | 11/2001 | Caldwell |
| 6,323,919 B1 | 11/2001 | Yang et al. |
| 6,369,369 B2 | 4/2002 | Kochman et al. |
| 6,377,009 B1 | 4/2002 | Philipp |
| 6,379,017 B2 | 4/2002 | Nakabayashi et al. |
| 6,380,931 B1 | 4/2002 | Gillespie et al. |
| 6,415,138 B2 | 7/2002 | Sirola et al. |
| 6,427,540 B1 | 8/2002 | Monroe et al. |
| 6,452,138 B1 | 9/2002 | Kochman et al. |
| 6,452,514 B1 | 9/2002 | Philipp |
| 6,456,027 B1 | 9/2002 | Pruessel |
| 6,457,355 B1 | 10/2002 | Philipp |
| 6,464,381 B2 | 10/2002 | Anderson, Jr. et al. |
| 6,466,036 B1 | 10/2002 | Philipp |
| 6,485,595 B1 | 11/2002 | Yenni, Jr. et al. |
| 6,529,125 B1 | 3/2003 | Butler et al. |
| 6,535,200 B2 | 3/2003 | Philipp |
| 6,537,359 B1 | 3/2003 | Spa |
| 6,559,902 B1 | 5/2003 | Kusuda et al. |
| 6,587,097 B1 | 7/2003 | Aufderheide et al. |
| 6,607,413 B2 | 8/2003 | Stevenson et al. |
| 6,614,579 B2 | 9/2003 | Roberts et al. |
| 6,617,975 B1 | 9/2003 | Burgess |
| 6,639,159 B2 | 10/2003 | Anzai |
| 6,652,777 B2 | 11/2003 | Rapp et al. |
| 6,654,006 B2 | 11/2003 | Kawashima et al. |
| 6,661,410 B2 | 12/2003 | Casebolt et al. |
| 6,664,489 B2 | 12/2003 | Kleinhans et al. |
| 6,713,897 B2 | 3/2004 | Caldwell |
| 6,734,377 B2 | 5/2004 | Gremm et al. |
| 6,738,051 B2 | 5/2004 | Boyd et al. |
| 6,740,416 B1 | 5/2004 | Yokogawa et al. |
| 6,756,970 B2 | 6/2004 | Keely, Jr. et al. |
| 6,773,129 B2 | 8/2004 | Anderson, Jr. et al. |
| 6,774,505 B1 * | 8/2004 | Wnuk .................. 307/10.8 |
| 6,794,728 B1 | 9/2004 | Kithil |
| 6,795,226 B2 | 9/2004 | Agrawal et al. |
| 6,809,280 B2 | 10/2004 | Divigalpitiya et al. |
| 6,812,424 B2 | 11/2004 | Miyako |
| 6,819,316 B2 | 11/2004 | Schulz et al. |
| 6,819,990 B2 | 11/2004 | Ichinose |
| 6,825,752 B2 | 11/2004 | Nahata et al. |
| 6,834,373 B2 | 12/2004 | Dieberger |
| 6,841,748 B2 | 1/2005 | Serizawa et al. |
| 6,847,018 B2 | 1/2005 | Wong |
| 6,847,289 B2 | 1/2005 | Pang et al. |
| 6,854,870 B2 | 2/2005 | Huizenga |
| 6,879,250 B2 | 4/2005 | Fayt et al. |
| 6,884,936 B2 | 4/2005 | Takahashi et al. |
| 6,891,114 B2 | 5/2005 | Peterson |
| 6,891,530 B2 | 5/2005 | Umemoto et al. |
| 6,897,390 B2 | 5/2005 | Caldwell et al. |
| 6,929,900 B2 | 8/2005 | Farquhar et al. |
| 6,930,672 B1 | 8/2005 | Kuribayashi |
| 6,940,291 B1 | 9/2005 | Ozick |
| 6,960,735 B2 | 11/2005 | Hein et al. |
| 6,962,436 B1 | 11/2005 | Holloway et al. |
| 6,964,023 B2 | 11/2005 | Maes et al. |
| 6,966,225 B1 | 11/2005 | Mallary |
| 6,967,587 B2 | 11/2005 | Snell et al. |
| 6,977,615 B2 | 12/2005 | Brandwein, Jr. |
| 6,987,605 B2 | 1/2006 | Liang et al. |
| 6,993,607 B2 | 1/2006 | Philipp |
| 6,999,066 B2 | 2/2006 | Litwiller |
| 7,030,513 B2 | 4/2006 | Caldwell |
| 7,046,129 B2 | 5/2006 | Regnet et al. |
| 7,053,360 B2 | 5/2006 | Balp et al. |
| 7,063,379 B2 | 6/2006 | Steuer et al. |
| 7,091,836 B2 | 8/2006 | Kachouh et al. |
| 7,091,886 B2 | 8/2006 | DePue et al. |
| 7,098,414 B2 | 8/2006 | Caldwell |
| 7,105,752 B2 | 9/2006 | Tsai et al. |
| 7,106,171 B1 | 9/2006 | Burgess |
| 7,135,995 B2 | 11/2006 | Engelmann et al. |
| 7,146,024 B2 | 12/2006 | Benkley, III |
| 7,151,450 B2 | 12/2006 | Beggs et al. |
| 7,151,532 B2 | 12/2006 | Schulz |
| 7,154,481 B2 | 12/2006 | Cross et al. |

(56) References Cited

U.S. PATENT DOCUMENTS

| | | |
|---|---|---|
| 7,180,017 B2 | 2/2007 | Hein |
| 7,186,936 B2 | 3/2007 | Marcus et al. |
| 7,205,777 B2 | 4/2007 | Schulz et al. |
| 7,215,529 B2 | 5/2007 | Rosenau |
| 7,218,498 B2 | 5/2007 | Caldwell |
| 7,232,973 B2 | 6/2007 | Kaps et al. |
| 7,242,393 B2 | 7/2007 | Caldwell |
| 7,245,131 B2 | 7/2007 | Kurachi et al. |
| 7,248,151 B2 | 7/2007 | Mc Call |
| 7,248,955 B2 | 7/2007 | Hein et al. |
| 7,254,775 B2 | 8/2007 | Geaghan et al. |
| 7,255,466 B2 | 8/2007 | Schmidt et al. |
| 7,255,622 B2 | 8/2007 | Stevenson et al. |
| 7,269,484 B2 | 9/2007 | Hein |
| 7,295,168 B2 | 11/2007 | Saegusa et al. |
| 7,295,904 B2 | 11/2007 | Kanevsky et al. |
| 7,339,579 B2 | 3/2008 | Richter et al. |
| 7,342,485 B2 | 3/2008 | Joehl et al. |
| 7,355,595 B2 | 4/2008 | Bathiche et al. |
| 7,361,860 B2 | 4/2008 | Caldwell |
| 7,385,308 B2 | 6/2008 | Yerdon et al. |
| 7,445,350 B2 | 11/2008 | Konet et al. |
| 7,479,788 B2 | 1/2009 | Bolender et al. |
| 7,489,053 B2 | 2/2009 | Gentile et al. |
| 7,521,941 B2 | 4/2009 | Ely et al. |
| 7,521,942 B2 | 4/2009 | Reynolds |
| 7,531,921 B2 | 5/2009 | Cencur |
| 7,532,202 B2 | 5/2009 | Roberts |
| 7,535,131 B1 | 5/2009 | Safieh, Jr. |
| 7,535,459 B2 | 5/2009 | You et al. |
| 7,567,240 B2 | 7/2009 | Peterson, Jr. et al. |
| 7,583,092 B2 | 9/2009 | Reynolds et al. |
| 7,643,010 B2 | 1/2010 | Westerman et al. |
| 7,653,883 B2 | 1/2010 | Hotelling et al. |
| 7,688,080 B2 | 3/2010 | Golovchenko et al. |
| 7,701,440 B2 | 4/2010 | Harley |
| 7,705,257 B2 | 4/2010 | Arione et al. |
| 7,708,120 B2 | 5/2010 | Einbinder |
| 7,714,846 B1 | 5/2010 | Gray |
| 7,719,142 B2 | 5/2010 | Hein et al. |
| 7,728,819 B2 | 6/2010 | Inokawa |
| 7,737,953 B2 | 6/2010 | Mackey |
| 7,737,956 B2 | 6/2010 | Hsieh et al. |
| 7,777,732 B2 | 8/2010 | Herz et al. |
| 7,782,307 B2 | 8/2010 | Westerman et al. |
| 7,791,594 B2 | 9/2010 | Dunko |
| 7,795,882 B2 | 9/2010 | Kirchner et al. |
| 7,800,590 B2 | 9/2010 | Satoh et al. |
| 7,821,425 B2 | 10/2010 | Philipp |
| 7,834,853 B2 | 11/2010 | Finney et al. |
| 7,839,392 B2 | 11/2010 | Pak et al. |
| 7,876,310 B2 | 1/2011 | Westerman et al. |
| 7,881,940 B2 | 2/2011 | Dusterhoff |
| RE42,199 E | 3/2011 | Caldwell |
| 7,898,531 B2 | 3/2011 | Bowden et al. |
| 7,920,131 B2 | 4/2011 | Westerman |
| 7,924,143 B2 | 4/2011 | Griffin et al. |
| 7,957,864 B2 | 6/2011 | Lenneman et al. |
| 7,977,596 B2 | 7/2011 | Born et al. |
| 7,978,181 B2 | 7/2011 | Westerman |
| 7,989,752 B2 | 8/2011 | Yokozawa |
| 8,026,904 B2 | 9/2011 | Westerman |
| 8,050,876 B2 | 11/2011 | Feen et al. |
| 8,054,296 B2 | 11/2011 | Land et al. |
| 8,054,300 B2 | 11/2011 | Bernstein |
| 8,077,154 B2 | 12/2011 | Emig et al. |
| 8,090,497 B2 | 1/2012 | Ando |
| 8,253,425 B2 | 8/2012 | Reynolds et al. |
| 8,283,800 B2 | 10/2012 | Salter et al. |
| 8,330,385 B2 | 12/2012 | Salter et al. |
| 8,339,286 B2 | 12/2012 | Cordeiro |
| 8,454,181 B2 | 6/2013 | Salter et al. |
| 8,508,487 B2 | 8/2013 | Schwesig et al. |
| 8,537,107 B1 | 9/2013 | Li |
| 8,575,949 B2 | 11/2013 | Salter et al. |
| 2001/0019228 A1 | 9/2001 | Gremm |
| 2001/0028558 A1 | 10/2001 | Rapp et al. |
| 2002/0040266 A1 | 4/2002 | Edgar et al. |
| 2002/0084721 A1 | 7/2002 | Walczak |
| 2002/0093786 A1 | 7/2002 | Maser |
| 2002/0149376 A1 | 10/2002 | Haffner et al. |
| 2002/0167439 A1 | 11/2002 | Bloch et al. |
| 2002/0167704 A1 | 11/2002 | Kleinhans et al. |
| 2003/0002273 A1 | 1/2003 | Anderson, Jr. et al. |
| 2003/0101781 A1 | 6/2003 | Budzynski et al. |
| 2003/0122554 A1 | 7/2003 | Karray et al. |
| 2003/0128116 A1 | 7/2003 | Ieda et al. |
| 2004/0056753 A1 | 3/2004 | Chiang et al. |
| 2004/0145613 A1 | 7/2004 | Stavely et al. |
| 2004/0160072 A1 | 8/2004 | Carter et al. |
| 2004/0160234 A1 | 8/2004 | Denen et al. |
| 2004/0160713 A1 | 8/2004 | Wei |
| 2004/0197547 A1 | 10/2004 | Bristow et al. |
| 2004/0246239 A1 | 12/2004 | Knowles et al. |
| 2005/0052429 A1 | 3/2005 | Philipp |
| 2005/0068712 A1 | 3/2005 | Schulz et al. |
| 2005/0088417 A1 | 4/2005 | Mulligan |
| 2005/0110769 A1 | 5/2005 | DaCosta et al. |
| 2005/0137765 A1 | 6/2005 | Hein et al. |
| 2005/0242923 A1 | 11/2005 | Pearson et al. |
| 2005/0275567 A1 | 12/2005 | DePue et al. |
| 2006/0022682 A1 | 2/2006 | Nakamura et al. |
| 2006/0038793 A1 | 2/2006 | Philipp |
| 2006/0044800 A1 | 3/2006 | Reime |
| 2006/0082545 A1 | 4/2006 | Choquet et al. |
| 2006/0170241 A1 | 8/2006 | Yamashita |
| 2006/0244733 A1 | 11/2006 | Geaghan |
| 2006/0262549 A1 | 11/2006 | Schmidt et al. |
| 2006/0267953 A1 | 11/2006 | Peterson, Jr. et al. |
| 2006/0279015 A1 | 12/2006 | Wang |
| 2006/0287474 A1 | 12/2006 | Crawford et al. |
| 2007/0008726 A1 | 1/2007 | Brown |
| 2007/0023265 A1 | 2/2007 | Ishikawa et al. |
| 2007/0051609 A1 | 3/2007 | Parkinson |
| 2007/0068790 A1 | 3/2007 | Yerdon et al. |
| 2007/0096565 A1 | 5/2007 | Breed et al. |
| 2007/0103431 A1 | 5/2007 | Tabatowski-Bush |
| 2007/0226994 A1 | 10/2007 | Wollach et al. |
| 2007/0232779 A1 | 10/2007 | Moody et al. |
| 2007/0247429 A1 | 10/2007 | Westerman |
| 2007/0255468 A1 | 11/2007 | Strebel et al. |
| 2007/0257891 A1 | 11/2007 | Esenther et al. |
| 2007/0296709 A1 | 12/2007 | GuangHai |
| 2008/0012835 A1 | 1/2008 | Rimon et al. |
| 2008/0018604 A1 | 1/2008 | Paun et al. |
| 2008/0023715 A1 | 1/2008 | Choi |
| 2008/0030465 A1 | 2/2008 | Konet et al. |
| 2008/0074398 A1 | 3/2008 | Wright |
| 2008/0111714 A1 | 5/2008 | Kremin |
| 2008/0136792 A1 | 6/2008 | Peng et al. |
| 2008/0142352 A1 | 6/2008 | Wright |
| 2008/0143681 A1 | 6/2008 | XiaoPing |
| 2008/0150905 A1 | 6/2008 | Grivna et al. |
| 2008/0158146 A1 | 7/2008 | Westerman |
| 2008/0196945 A1 | 8/2008 | Konstas |
| 2008/0202912 A1 | 8/2008 | Boddie et al. |
| 2008/0231290 A1 | 9/2008 | Zhitomirsky |
| 2008/0238650 A1 | 10/2008 | Riihimaki et al. |
| 2008/0257706 A1 | 10/2008 | Haag |
| 2008/0272623 A1 | 11/2008 | Kadzban et al. |
| 2009/0066659 A1 | 3/2009 | He et al. |
| 2009/0079699 A1 | 3/2009 | Sun |
| 2009/0108985 A1 | 4/2009 | Haag et al. |
| 2009/0115731 A1 | 5/2009 | Rak |
| 2009/0120697 A1 | 5/2009 | Wilner et al. |
| 2009/0135157 A1 | 5/2009 | Harley |
| 2009/0225043 A1 | 9/2009 | Rosener |
| 2009/0235588 A1 | 9/2009 | Patterson et al. |
| 2009/0236210 A1 | 9/2009 | Clark et al. |
| 2009/0251435 A1 | 10/2009 | Westerman et al. |
| 2009/0256677 A1 | 10/2009 | Hein et al. |
| 2009/0309616 A1 | 12/2009 | Klinghult et al. |
| 2010/0001974 A1 | 1/2010 | Su et al. |
| 2010/0007613 A1 | 1/2010 | Costa |

(56) References Cited

U.S. PATENT DOCUMENTS

| | | |
|---|---|---|
| 2010/0007620 A1 | 1/2010 | Hsieh et al. |
| 2010/0013777 A1 | 1/2010 | Baudisch et al. |
| 2010/0026654 A1 | 2/2010 | Suddreth |
| 2010/0039392 A1 | 2/2010 | Pratt et al. |
| 2010/0090712 A1 | 4/2010 | Vandermeijden |
| 2010/0090966 A1 | 4/2010 | Gregorio |
| 2010/0102830 A1 | 4/2010 | Curtis et al. |
| 2010/0103139 A1 | 4/2010 | Soo et al. |
| 2010/0110037 A1 | 5/2010 | Huang et al. |
| 2010/0125393 A1 | 5/2010 | Jarvinen et al. |
| 2010/0156814 A1 | 6/2010 | Weber et al. |
| 2010/0177057 A1 | 7/2010 | Flint et al. |
| 2010/0188356 A1 | 7/2010 | Vu et al. |
| 2010/0188364 A1 | 7/2010 | Lin et al. |
| 2010/0194692 A1 | 8/2010 | Orr et al. |
| 2010/0207907 A1 | 8/2010 | Tanabe et al. |
| 2010/0212819 A1 | 8/2010 | Salter et al. |
| 2010/0214253 A1 | 8/2010 | Wu et al. |
| 2010/0219935 A1 | 9/2010 | Bingle et al. |
| 2010/0241431 A1 | 9/2010 | Weng et al. |
| 2010/0241983 A1 | 9/2010 | Walline et al. |
| 2010/0245286 A1 | 9/2010 | Parker |
| 2010/0250071 A1 | 9/2010 | Pala et al. |
| 2010/0277431 A1 | 11/2010 | Klinghult |
| 2010/0280983 A1 | 11/2010 | Cho et al. |
| 2010/0286867 A1 | 11/2010 | Bergholz et al. |
| 2010/0289754 A1 | 11/2010 | Sleeman et al. |
| 2010/0289759 A1 | 11/2010 | Fisher et al. |
| 2010/0296303 A1 | 11/2010 | Sarioglu et al. |
| 2010/0302200 A1 | 12/2010 | Netherton et al. |
| 2010/0315267 A1 | 12/2010 | Chung et al. |
| 2010/0321214 A1 | 12/2010 | Wang et al. |
| 2010/0321321 A1 | 12/2010 | Shenfield et al. |
| 2010/0321335 A1 | 12/2010 | Lim et al. |
| 2010/0328261 A1 | 12/2010 | Woolley et al. |
| 2010/0328262 A1 | 12/2010 | Huang et al. |
| 2011/0001707 A1 | 1/2011 | Faubert et al. |
| 2011/0001722 A1 | 1/2011 | Newman et al. |
| 2011/0007021 A1 | 1/2011 | Bernstein et al. |
| 2011/0007023 A1 | 1/2011 | Abrahamsson et al. |
| 2011/0012623 A1 | 1/2011 | Gastel et al. |
| 2011/0018744 A1 | 1/2011 | Philipp |
| 2011/0018817 A1 | 1/2011 | Kryze et al. |
| 2011/0022393 A1 | 1/2011 | Waller et al. |
| 2011/0031983 A1 | 2/2011 | David et al. |
| 2011/0034219 A1 | 2/2011 | Filson et al. |
| 2011/0037725 A1 | 2/2011 | Pryor |
| 2011/0037735 A1 | 2/2011 | Land et al. |
| 2011/0039602 A1 | 2/2011 | McNamara et al. |
| 2011/0043481 A1 | 2/2011 | Bruwer |
| 2011/0050251 A1 | 3/2011 | Franke et al. |
| 2011/0050587 A1 | 3/2011 | Natanzon et al. |
| 2011/0050618 A1 | 3/2011 | Murphy et al. |
| 2011/0050620 A1 | 3/2011 | Hristov |
| 2011/0055753 A1 | 3/2011 | Horodezky et al. |
| 2011/0062969 A1 | 3/2011 | Hargreaves et al. |
| 2011/0063425 A1 | 3/2011 | Tieman |
| 2011/0074573 A1 | 3/2011 | Seshadri |
| 2011/0080365 A1 | 4/2011 | Westerman |
| 2011/0080366 A1 | 4/2011 | Bolender |
| 2011/0080376 A1 | 4/2011 | Kuo et al. |
| 2011/0082616 A1 | 4/2011 | Small et al. |
| 2011/0083110 A1 | 4/2011 | Griffin et al. |
| 2011/0095997 A1 | 4/2011 | Philipp |
| 2011/0115732 A1 | 5/2011 | Coni et al. |
| 2011/0115742 A1 | 5/2011 | Sobel et al. |
| 2011/0134047 A1 | 6/2011 | Wigdor et al. |
| 2011/0134054 A1 | 6/2011 | Woo et al. |
| 2011/0141006 A1 | 6/2011 | Rabu |
| 2011/0141041 A1 | 6/2011 | Parkinson et al. |
| 2011/0148803 A1 | 6/2011 | Xu |
| 2011/0157037 A1 | 6/2011 | Shamir et al. |
| 2011/0157079 A1 | 6/2011 | Wu et al. |
| 2011/0157080 A1 | 6/2011 | Ciesla et al. |
| 2011/0157089 A1 | 6/2011 | Rainisto |
| 2011/0161001 A1 | 6/2011 | Fink |
| 2011/0169758 A1 | 7/2011 | Aono |
| 2011/0187492 A1 | 8/2011 | Newman et al. |
| 2011/0279276 A1 | 11/2011 | Newham |
| 2011/0279409 A1 | 11/2011 | Salaverry et al. |
| 2012/0007821 A1 | 1/2012 | Zaliva |
| 2012/0037485 A1 | 2/2012 | Sitarski |
| 2012/0043976 A1 | 2/2012 | Bokma et al. |
| 2012/0055557 A1 | 3/2012 | Belz et al. |
| 2012/0062247 A1 | 3/2012 | Chang |
| 2012/0062498 A1 | 3/2012 | Weaver et al. |
| 2012/0068956 A1 | 3/2012 | Jira et al. |
| 2012/0154324 A1 | 6/2012 | Wright et al. |
| 2012/0217147 A1 | 8/2012 | Porter et al. |
| 2012/0312676 A1 | 12/2012 | Salter et al. |
| 2012/0313648 A1 | 12/2012 | Salter et al. |
| 2013/0036529 A1 | 2/2013 | Salter et al. |
| 2013/0076121 A1 | 3/2013 | Salter et al. |
| 2013/0093500 A1 | 4/2013 | Bruwer |
| 2013/0106436 A1 | 5/2013 | Brunet et al. |
| 2013/0113397 A1 | 5/2013 | Salter et al. |
| 2013/0113544 A1 | 5/2013 | Salter et al. |
| 2013/0126325 A1 | 5/2013 | Curtis et al. |
| 2013/0270896 A1 | 10/2013 | Buttolo et al. |
| 2013/0270899 A1 | 10/2013 | Buttolo et al. |
| 2013/0271157 A1 | 10/2013 | Buttolo et al. |
| 2013/0271159 A1 | 10/2013 | Santos et al. |
| 2013/0271182 A1 | 10/2013 | Buttolo et al. |
| 2013/0271202 A1 | 10/2013 | Buttolo et al. |
| 2013/0271203 A1 | 10/2013 | Salter et al. |
| 2013/0271204 A1 | 10/2013 | Salter et al. |
| 2013/0291439 A1 | 11/2013 | Wuerstlein et al. |
| 2013/0307610 A1 | 11/2013 | Salter et al. |
| 2013/0321065 A1 | 12/2013 | Salter et al. |
| 2013/0328616 A1 | 12/2013 | Buttolo et al. |
| 2014/0145733 A1 | 5/2014 | Buttolo et al. |

FOREIGN PATENT DOCUMENTS

| | | |
|---|---|---|
| EP | 1327860 | 7/2003 |
| EP | 1562293 | 8/2005 |
| EP | 2133777 | 10/2011 |
| EP | 2133777 B1 | 10/2011 |
| GB | 2071338 | 9/1981 |
| GB | 2158737 | 11/1985 |
| GB | 2279750 | 1/1995 |
| GB | 2409578 | 6/2005 |
| GB | 2418741 | 4/2006 |
| JP | 61188515 | 8/1986 |
| JP | 4065038 | 3/1992 |
| JP | 04082416 | 3/1992 |
| JP | 07315880 | 12/1995 |
| JP | 08138446 | 5/1996 |
| JP | 11065764 | 3/1999 |
| JP | 11110131 | 4/1999 |
| JP | 11260133 | 9/1999 |
| JP | 11316553 | 11/1999 |
| JP | 2000047178 | 2/2000 |
| JP | 2000075293 | 3/2000 |
| JP | 2001013868 | 1/2001 |
| JP | 2006007764 | 1/2006 |
| JP | 2007027034 | 2/2007 |
| JP | 2008033701 | 2/2008 |
| JP | 2010139362 | 6/2010 |
| JP | 2010165618 | 7/2010 |
| JP | 2010218422 | 9/2010 |
| JP | 2010239587 | 10/2010 |
| JP | 2010287148 | 12/2010 |
| JP | 2011014280 | 1/2011 |
| KR | 20040110463 | 12/2004 |
| KR | 20090127544 | 12/2009 |
| KR | 20100114768 | 10/2010 |
| WO | 9636960 | 11/1996 |
| WO | 9963394 | 12/1999 |
| WO | 2006093398 | 9/2006 |
| WO | 2007022027 | 2/2007 |
| WO | 2008121760 | 10/2008 |
| WO | 2009054592 | 4/2009 |
| WO | 2010111362 | 9/2010 |

(56) References Cited

FOREIGN PATENT DOCUMENTS

| WO | 2012032318 | 3/2012 |
|---|---|---|
| WO | 2012032318 A1 | 3/2012 |
| WO | 2012169106 | 12/2012 |
| WO | 2012169106 A1 | 12/2012 |

OTHER PUBLICATIONS

Van Ess, Dave et al., "Capacitive Touch Switches for Automotive Applications," 7 pages, Published in Automotive DesignLine, www.automotiedesignline.com, Feb. 2006.

"Introduction to Touch Solutions, White Paper, Rivision 1.0 A," Densitron Corporation, 14 pages, Aug. 21, 2007.

Kliffken, Marksu G. et al., "Obstacle Detection for Power Operated Window-Lift and Sunroof Actuation Systems," Paper No. 2001-01-0466, 1 page, © 2011 SAE International, Published Mar. 5, 2001.

NXP Capacitive Sensors, 1 page, www.nxp.com, copyrighted 2006-2010, NXP Semiconductors.

"Moisture Immunity in QuickSense Studio," AN552, Rev. 0.1 10/10, 8 pages, Silicon Laboratories, Inc., © 2010.

"CLEVIOS P Formulation Guide," 12 pages, www.clevios.com, Heraeus Clevios GmbH, no date provided.

"Charge-Transfer Sensing-Based Touch Controls Facilitate Creative Interfaces," www.ferret.com.au, 2 pages, Jan. 18, 2006.

Kiosk Peripherals, "Touch Screen," www.bitsbytesintegrators.com/kiosk-peripherals.html, 10 pp., no. date provided.

JVC KD-AVX777 Detachable Front-Panel with Integrated 5.4 Touch-Screen Monitor, 6 pages, www.crutchfield.com, no date provided.

Ergonomic Palm Buttons, Pepperl+Fuchs, www.wolfautomation.com, 6 pages, no date provided.

"Orgacon EL-P3000, Screen printing Ink Series 3000," 2 pages, AGFA, last updated in Feb. 2006.

"Touch Sensors Design Guide" by ATMEL, 10620 D-AT42-04/09, Revised Apr. 2009, 72 pages, Copyrighted 2008-2009 Atmel Corporation.

U.S. Appl. No. 13/609,390, filed Sep. 11, 2012, entitled "Proximity Switch Based Door Latch Release," (14 pages of specification and 4 pages of drawings) and Official Filing Receipt (3 pages).

U.S. Appl. No. 13/665,253, filed Oct. 31, 2012, entitled Proximity Switch Assembly Having Round Layer, (15 pages of specification and 7 pages of drawings) and Official Filing Receipt (3 pages).

U.S. Appl. No. 13/799,413, filed Mar. 13, 2013, entitled "Proximity Interface Development System Having Replicator and Method," (29 pages of specification and 20 pages of drawings) and Official Filing Receipt (3 pages).

U.S. Appl. No. 13/799,478, filed Mar. 13, 2013, entitled "Proximity Interface Development System Having Analyzer and Method," (29 pages of specification and 20 pages of drawings) and Official Filing Receipt (3 pages).

U.S. Appl. No. 14/168,614, filed Jan. 30, 2014, entitled "Proximity Switch Assembly and Activation Method Having Virtual Button Mode," (30 pages of specification and 15 pages of drawings) and Official Filing Receipt (3 pages).

U.S. Appl. No. 14/314,328, filed Jun. 25, 2014, entitled "Proximity Switch Assembly Having Pliable Surface and Depression," (43 pages of specification and 24 pages of drawings) and Official Filing Receipt (3 pages).

U.S. Appl. No. 14/314,364, filed Jun. 25, 2014, entitled "Proximity Switch Assembly Having Groove Between Adjacent Proximity Sensors," (43 pages of specification and 24 pages of drawings) and Official Filing Receipt (3 pages).

\* cited by examiner

PROXIMITY SWITCH ASSEMBLY HAVING VARYING SIZE ELECTRODE FINGERS

FIELD OF THE INVENTION

The present invention generally relates to lamps and switches therefor, and more particularly relates to a lamp assembly having a proximity switch.

BACKGROUND OF THE INVENTION

Automotive vehicles are typically equipped with various user actuatable switches for operating devices including powered windows, headlights, windshield wipers, moonroofs or sunroofs, interior lighting, radio and infotainment devices, and various other devices. Generally, these types of switches need to be actuated by a user in order to activate or deactivate a device or perform some type of control function. Proximity switches, such as capacitive switches, employ one or more proximity sensors to generate a sense activation field and sense changes to the activation field indicative of user actuation of the switch, typically caused by a user's finger in close proximity or contact with the sensor. Capacitive switches are typically configured to detect user actuation of the switch based on comparison of the sense activation field to a threshold.

Automotive lamp assemblies typically include a separate mechanical switch for activating the lighting device. Some lamp assemblies include a depressible lamp assembly that moves to activate a push switch to turn the light on and off. With the availability of proximity switches, a proximity switch may be employed to control activation of the light device. It would be desirable to provide for a proximity switch which is easy to package and use and does not interfere with the lighting function or other switches.

SUMMARY OF THE INVENTION

According to one aspect of the present invention, a proximity switch is provided. The proximity switch includes a sensing pad and a proximity sensor disposed near a perimeter of the sensing pad. The proximity sensor generates an activation field proximate to the sensing pad. The proximity sensor includes a plurality of interdigitated electrode fingers having differing lengths and spacings.

According to another aspect of the present invention, a proximity switch is provided that includes a sensing pad and a proximity sensor disposed near a perimeter of the sensing pad. The proximity sensor includes inner electrode fingers interdigitated and electrically coupled to outer electrode fingers to generate an activation field proximate to the sensing pad. The inner and outer electrode fingers have a different length and spacing on one side of the sensing pad as compared to another side of the sensing pad.

According to a further aspect of the present invention, a lamp and proximity switch assembly is provided. The lamp and proximity switch assembly includes a lens having a transparent window and a light source disposed to illuminate light through the transparent window of the lens. The lamp and proximity switch assembly also includes a proximity sensor disposed near a perimeter of the transparent window and generating an activation field proximate to the transparent window. The proximity sensor includes a plurality of interdigitated electrode fingers having differing lengths and spacings.

These and other aspects, objects, and features of the present invention will be understood and appreciated by those skilled in the art upon studying the following specification, claims, and appended drawings.

DETAILED DESCRIPTION OF THE PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
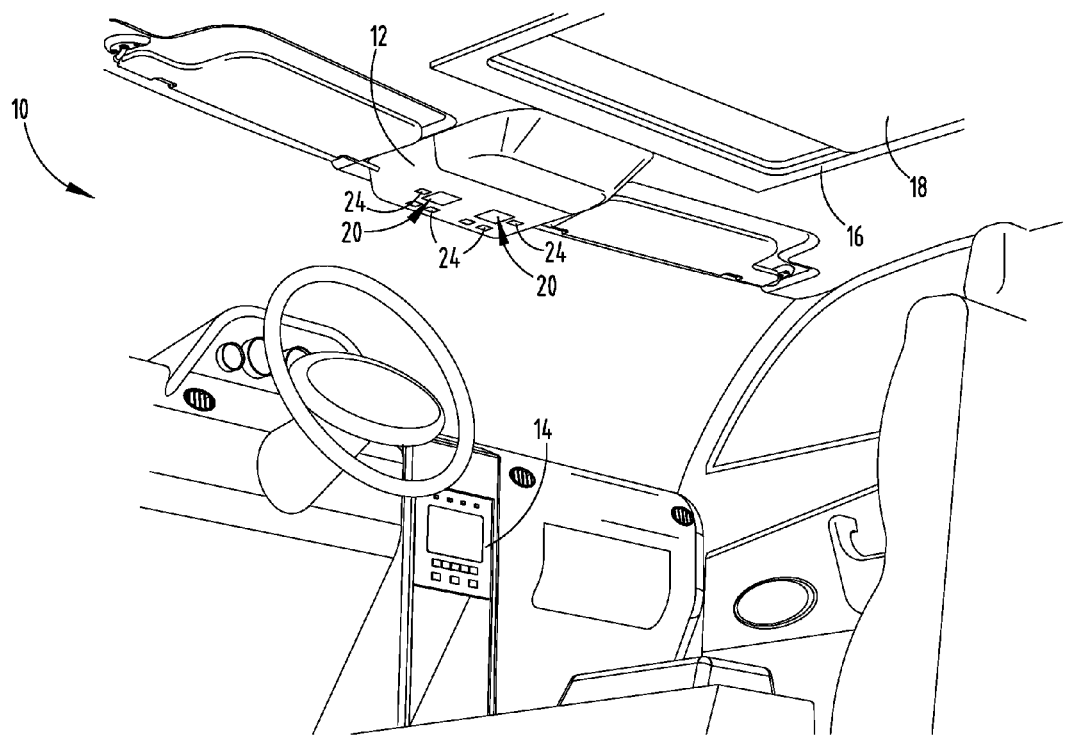
FIG. 1 is a perspective view of a passenger compartment of an automotive vehicle having an overhead console employing a pair of lamp and proximity switch assemblies, according to one embodiment.
Figure 2:
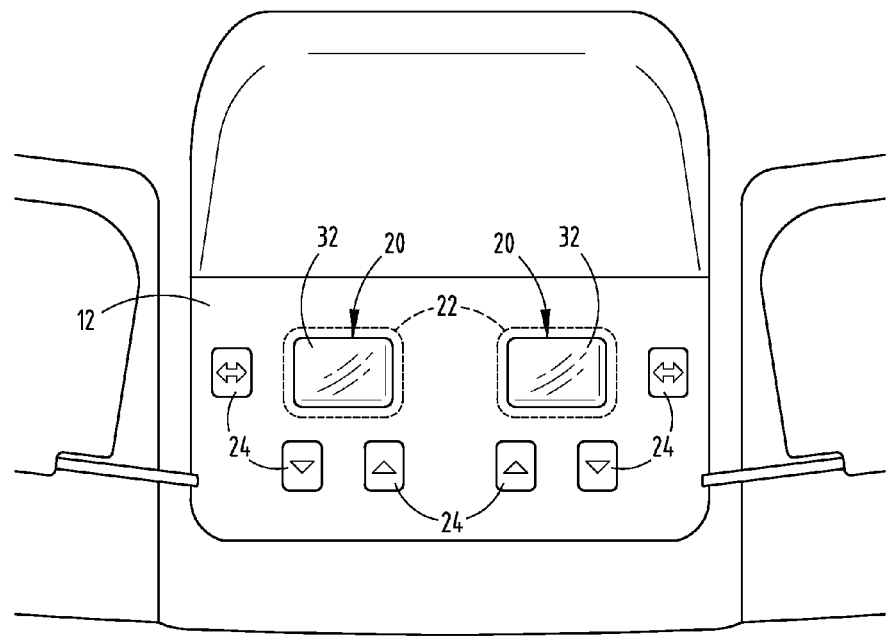
FIG. 2 is an enlarged view of the overhead console with lamp and proximity switch assemblies shown in FIG. 1.

Referring to FIGS. 1 and 2, the passenger compartment interior of an automotive vehicle 10 is generally illustrated having a pair of lamp and switch assemblies 20 and a plurality of proximity switches 24 assembled in an overhead console 12, according to one embodiment. The vehicle 10 generally includes the overhead console 12 assembled to the headliner on the underside of the roof or ceiling at the top of the vehicle passenger compartment, generally above the front passenger seating area. Each of the pair of lamp and switch assemblies 20 provides an integral assembly of a lamp and a proximity switch 22 for activating a light source to turn the lamp on and off. Each lamp and proximity switch assembly 20 includes a lens 32 having a light transparent window, a light source disposed behind the lens to illuminate light through the transparent window of the lens, and a proximity switch 22 having one or more proximity sensors disposed near a perimeter of the transparent window of the lens and generating an activation field proximate to the transparent field of the lens to sense activation of the proximity switch to control activation of the light source. In the embodiment shown, the proximity switch 22 is integrally assembled as part of the lamp assembly in which the transparent window of the lens serves as a sensing pad. The user may contact the sensing pad or come into close proximity therewith to be detected by the activation field. However, it should be appreciated that the proximity switch 22 may be assembled separate from the lamp assembly and employ its own sensing pad and may control any of a number of devices or functions.

A user may activate the light source by activating the proximity switch integrally provided with the lamp and switch assembly 20. The lamp may serve as an interior map or reading lamp to provide interior lighting to the vehicle 10, according to one embodiment. The lamp and switch assembly 20 may also serve as a dome lamp to provide lighting in the interior of the vehicle 10. It should be appreciated that the lamp may serve to provide lighting to the interior of the vehicle for other uses and the lamp and switch assembly 20 may be located elsewhere on the vehicle 10. For example, the lamp and switch assembly 20 may be located in the headliner, a visor, a grab handle, a center console, or elsewhere on the vehicle 10.

Each proximity switch 22 provided in each lamp and switch assembly 20 is shown and described herein as a capacitive switch, according to one embodiment. Each proximity switch 22 includes a proximity sensor that provides a sense activation field to sense contact or close proximity of an object, such as a user's finger, in close relation to the proximity sensor, such as a tap or swiping motion by a user's finger. Thus, the sense activation field generated by the proximity sensor of each proximity switch is a capacitive field in the exemplary embodiment, and the user's finger has electrical conductivity and dielectric properties that cause a change or disturbance in the sense activation field as should be evident to those skilled in the art. However, it should also be appreciated by those skilled in the art that additional or alternative types of proximity sensors can be used, such as, but not limited to, inductive sensors, optical sensors, temperatures sensors, resistive sensors, the like, or a combination thereof. Exemplary proximity sensors are described in the Apr. 9, 2009, ATMEL® Touch Sensors Design Guide, 10620 D-AT42-04/09, the entire reference hereby being incorporated herein by reference.

A plurality of proximity switches 24 are also shown generally arranged close to one another in the overhead console 12. The various proximity switches 24 may control any of a number of vehicle devices and functions, such as controlling movement of a sunroof or moonroof 16, controlling movement of a moonroof shade 18, controlling activation of one or more lighting devices, and controlling various other devices and functions. While the lamp and switch assembly 20 with proximity switch 22 and proximity switches 24 are shown located in an overhead console 12, it should be appreciated that the assembly 20 and proximity switches 22 and 24 may be located elsewhere on the vehicle 10, such as in the dash panel, on other consoles such as a center console, integrated into a touch screen display for a radio or infotainment system such as a navigation and/or audio display, or located elsewhere onboard the vehicle 10 according to various vehicle applications.

The proximity switches 24 are shown and described herein as capacitive switches, according to one embodiment. Each proximity switch 24 includes one or more proximity sensors that provide a sense activation field to sense contact or close proximity of a user in close relation on to the one or more proximity sensors, such as a tap or swiping motion by a user's finger. Thus, the sense activation field of each proximity switch 24 is a capacitive field in the exemplary embodiment and the user's finger has electrical conductivity and dielectric properties that cause a change or disturbance in the sense activation field as should be evident to those skilled in the art.

Figure 3:
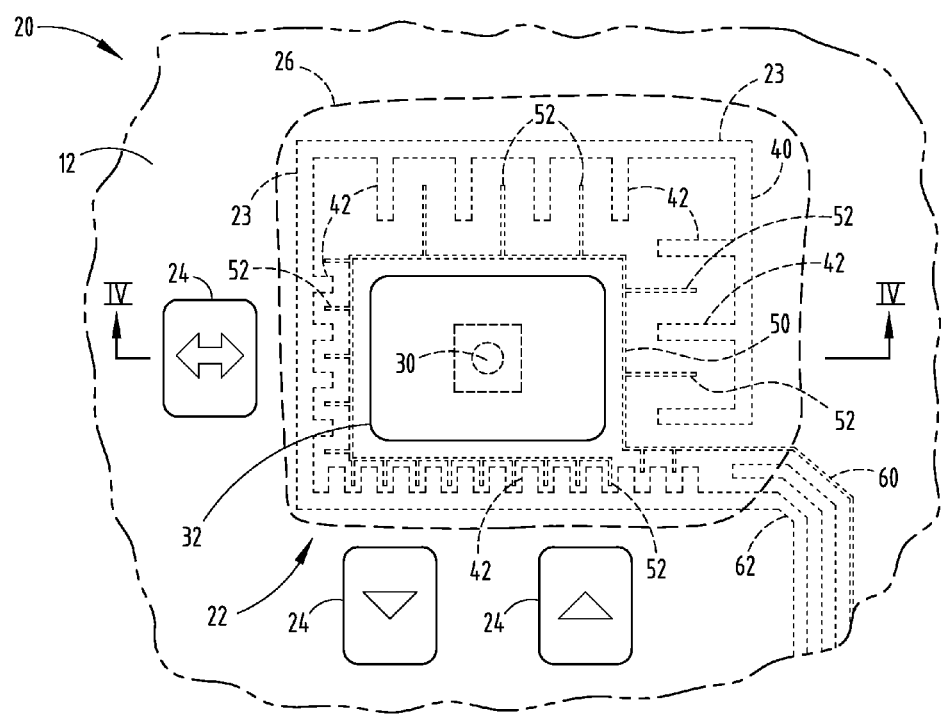
FIG. 3 is an enlarged view of one lamp and proximity switch assembly having a proximity switch arrangement, according to one embodiment.
Figure 4:
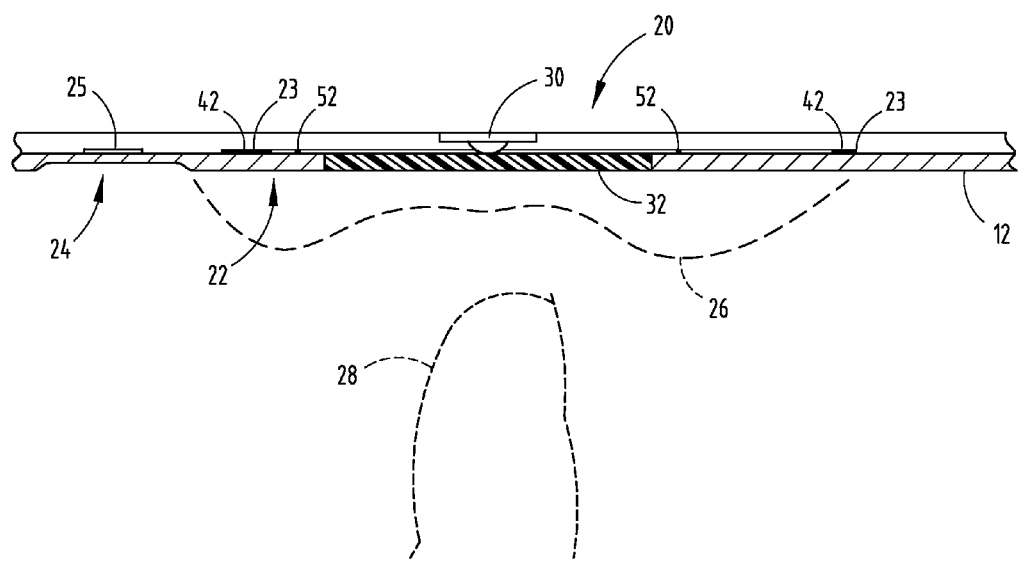
FIG. 4 is a cross-sectional view taken through line IV-IV of FIG. 3 illustrating the lamp and switch assembly in relation to a user's finger.

Referring to FIGS. 3 and 4, the lamp and switch assembly 20 is generally illustrated having a lens 32 made of a transparent material integrally molded as part of the overhead console 12. The transparent window 32 of the lens is light transmissive to allow visible light waves to pass through the transparent window. A lamp or light source 30 is disposed above the transparent window of the lens 32 to illuminate light through the transparent window of the lens 32. The light source 30 may include a light emitting diode (LED) mounted to a circuit board, according to one embodiment. Other light sources such as an incandescent bulb or combination of one or more light sources may be employed, according to other embodiments. The lens 32 may be integrally formed as part of the overhead console 12 and having the transparent window formed therein, according to one embodiment. In this embodiment, the transparent window may be molded as part of or into a polymeric material forming the overhead console 12. According to other embodiments, the lens 32 may be formed as a separate component and assembled to the overhead console 12. In such embodiments, the lens 32 may be fixedly mounted to the overhead console 12 via fasteners, adhesive or other mounting connection and generally does not move relative to the overhead console 12.

The lamp and proximity switch assembly 20 includes a proximity switch 22 disposed near a perimeter of the transparent window of the lens 32. The proximity switch 22 has a proximity sensor 23 for generating an activation field 26 proximate to the transparent window 32 to sense activation of the proximity switch 22 to control activation of the light source 30, according to one embodiment. In the embodiment shown, the proximity switch 22 has a single proximity sensor 23 configured to extend on all four sides of the lens 32 to substantially surround the transparent window of the lens 32. In this embodiment, the proximity switch 22 substantially surrounds the lens 32 to generate an activation field 26 generally across substantially the entire bottom surface of the lens 32 and below the lens 32 as seen in FIGS. 3 and 4. In other embodiments, the proximity sensor 23 may extend on two or three sides of the sensing pad.

According to one embodiment, the proximity sensor 23 is applied as an electrically conductive ink onto a substrate shown as the upper side of the overhead console 12 about the perimeter of the lens 32. The conductive ink forms electrodes 40 and 50 that serve to provide a capacitance which produces the activation field 26. It should be appreciated that other forms of capacitive sensors may be employed to generate the activation field 26. It should be appreciated that the activation field 26 generated by the proximity switch 22 extends below the transparent window of the lens 32 to enable an object, such as a user's finger 28, hand or other body part to enter the activation field 26 to activate the light source 32 on and off. When an object, such as finger 28 sufficiently engages the activation field 26 below the sensing pad, e.g., lens 32, a disturbance in the activation field 26 is detected such that activation of the proximity switch 22 is initiated so as to either switch the light source 32 on or switch the light source 32 off Referring to FIGS. 3, 5 and 6, the electrode configuration of the proximity sensor 23 is illustrated, according to one embodiment. Sensor 23 includes an outer electrode 40 having inward extending fingers or plates 42, and an inner electrode 50 having outer extending fingers or plates 52. Electrode fingers 42 are interdigitated with electrode fingers 52 to provide a capacitive coupling between the outer electrode 40 and inner electrode 50. The capacitive coupling produces the activation field 26. The plurality of interdigitated electrode fingers 42 and 52 have different lengths and spacings between interdigitated fingers as described herein so as to configure the activation field 26 to exhibit less interference with the other nearby proximity switches 24.

The outer electrode 40 is shown substantially surrounding the inner electrode 42, and both the inner and outer electrodes 50 and 40 surround the perimeter of the transparent window of lens 52 which serves as a sensing pad. The outer electrode 60 is coupled to a first signal line 60, while the inner electrode 50 is coupled to a second signal line 60. A pulsed drive input signal (e.g., voltage) is applied to one of signal lines 60 and 62, and an output voltage proportional to the capacitance is received on the other of signal line 60 and 62. The input voltage provides a charge coupling on one of the inner and outer electrodes while the other of the inner and outer electrodes provides a signal indicative of the capacitive coupling between the inner and outer electrodes 40 and 50. The output signal and the input signal may be processed by control circuitry, such as a controller, to determine whether an object, such as a user's finger, is sufficiently interacting with the activation field 26 to activate the proximity switch 22.

The proximity switch 22 employs a proximity sensor 23 disposed near a perimeter of the sensing pad, shown as lens 32, and generates an activation field 26 proximate to the sensing pad. The proximity sensor includes a plurality of interdigitated electrode fingers having differing lengths and spacings. As seen in this embodiment, the interdigitated electrode fingers 42 and 52 have a first length and a first spacing therebetween along the portion of the electrodes 40 and 50 on the bottom and left sides of lens 32 which are adjacent to neighboring proximity switches 24. The length and spacing between the interdigitated fingers 42 and 52 is greater on the top and right sides of lens 32 where there are no other nearby proximity switches to interfere with the activation field 26. The second length L of electrode fingers 52 and 42 and the second spacing S between the interdigitated electrode fingers on the top and right sides is substantially greater than the first length L and first spacing S on the bottom and left sides so as to create a variable length and spacing electrode configuration. By varying the length and spacing of the electrode fingers 42 and 52, the activation field 26 may be shaped so it does not extend far enough out from the sensing pad or lens 32 to interfere with the adjacent proximity switches 24 and yet provides a sufficient coverage across the entire sensing pad or lens 32 due to the longer length and spacing of interdigitated fingers on the opposite side.

It should be appreciated that the activation field 26 is generally constrained to the region below the transparent window of the lens 32 such that it does not interfere with nearby proximity switches 24. The nearby proximity switches 24 are shown assembled to the overhead console 12 near the lamp assembly 20. The proximity switches 24 each have a proximity sensor 25 that may be formed as a conductive ink applied onto a substrate such as the upper surface of the polymeric overhead console 12. It should be appreciated that proximity sensor 25 may be otherwise formed as a pre-assembled pad. The proximity switches 24 are disposed at a distance sufficiently away from the lamp and switch assembly 20 and switch 22.

In the embodiment shown, the proximity sensor 23 is disposed near a perimeter of the sensing pad or lens 32 such that the proximity sensor substantially surrounds the sensing pad or lens 32. Thus, the proximity sensor 23 and electrodes 40 and 50 extends around the left, right, top and bottom sides of the sensing pad or lens 32. It should be appreciated that other sensing pad and electrode configurations may be employed having various shapes and extending along two or more sides of the sensing pad. In addition, it should be appreciated that the proximity sensor 23 may be formed on the lens 32, according to another embodiment.

According to one example, the shorter length electrode fingers may have a first length of 1 mm, whereas the longer length electrode fingers may have a second length of 8 mm. The first spacing between the shorter length electrode fingers 1 mm, whereas the second spacing between the longer length electrode fingers of 5 mm. Additionally, the thickness of the electrode fingers or plates may vary, such that the shorter electrode fingers having a closer spacing are thinner than the electrode fingers that have a longer length and longer spacing therebetween. According to one example, the shorter electrode fingers may have a 1 millimeter thickness as compared to a 4 millimeter thickness for the longer length and spaced electrode fingers.

Figure 5:
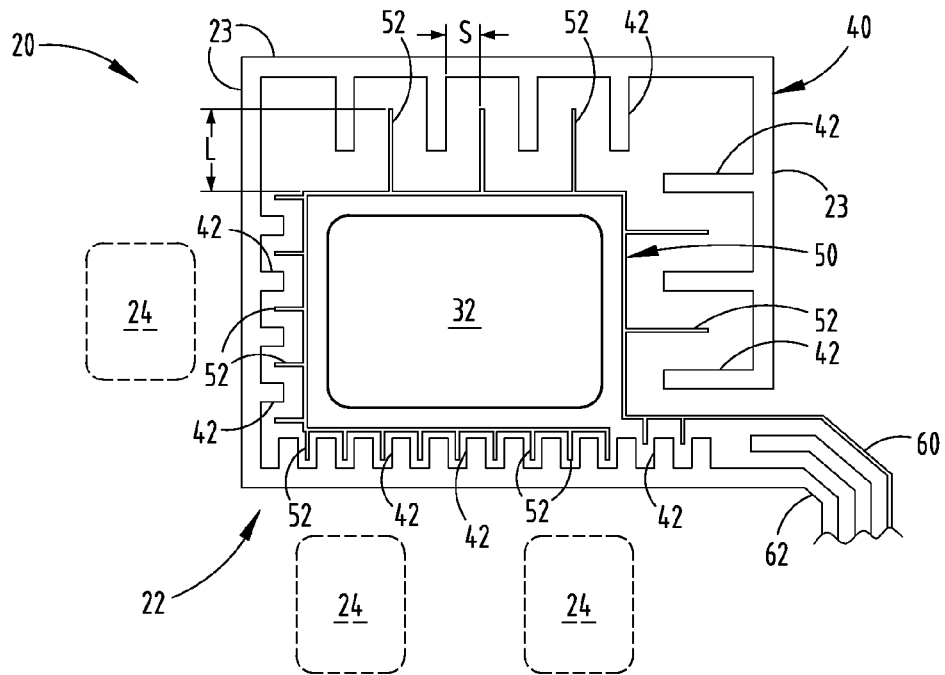
FIG. 5 is a front view of the lamp and proximity switch assembly shown in FIG. 3 with the sensor electrode assembly shown in solid lines.
Figure 6:
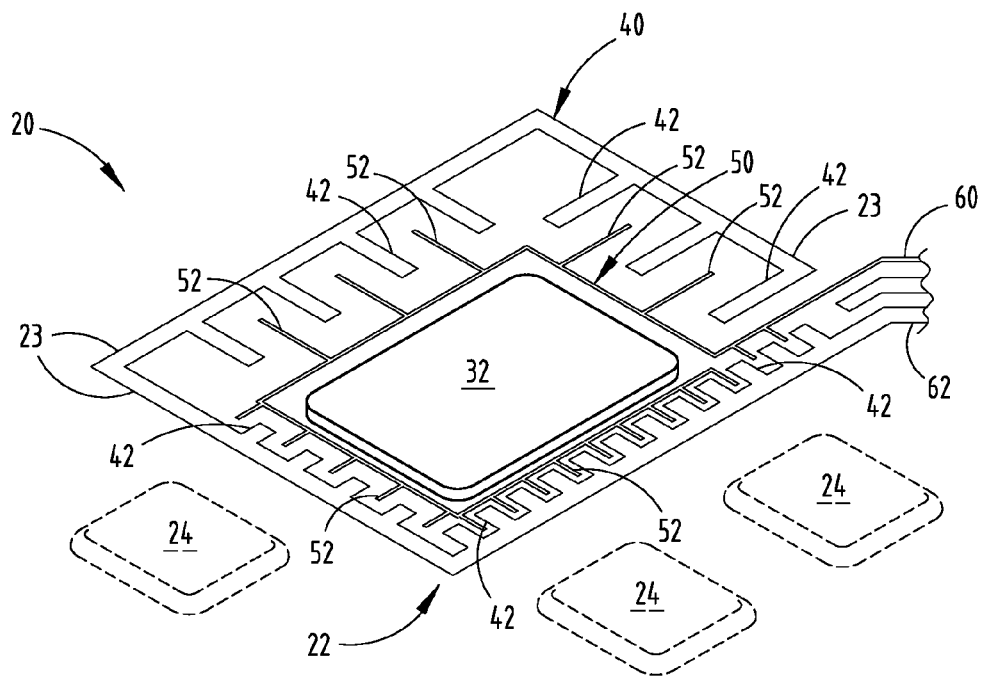
FIG. 6 is a perspective view of the lamp and proximity switch assembly further illustrating the activation field.
Figure 7:
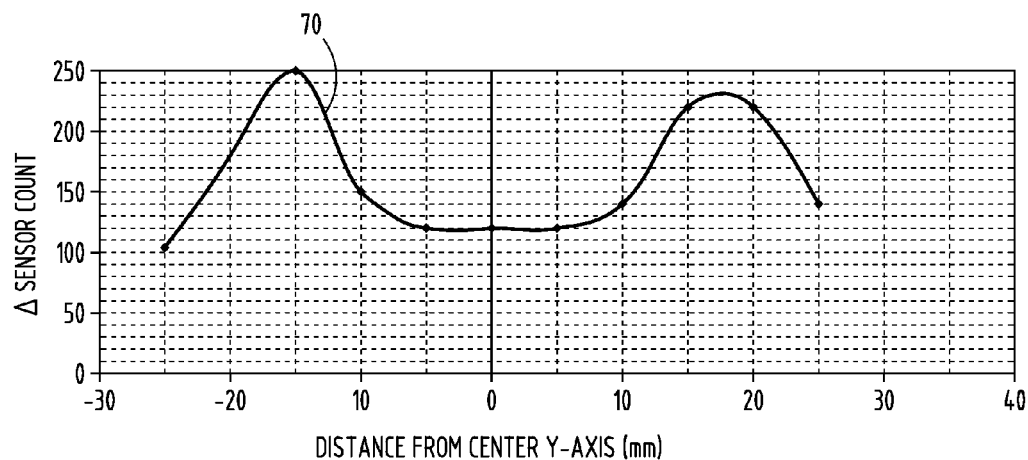
FIG. 7 is a graph illustrating the signal response associated with the proximity switch shown in FIG. 3 as a user's finger moves diagonally across the switch.

Referring to FIG. 7, a signal response 70 generated by the proximity sensor is shown illustrating the capacitance output as a Δ count value as a function of distance from center of the sensing pad as a user slides a finger diagonally from the bottom left side (corner) of the proximity switch 22 to the upper right side (corner) of the proximity switch 22 as seen in FIG. 5. As the finger approaches the activation field on the bottom left corner, the Δ count value increases as the finger moves toward the center and reaches a peak near the center of the interdigitated fingers and then ramps down to a lower value as the finger proceeds to move towards the center. At the center, there is sufficient strength in the activation signal to allow a user to activate the switch. As the finger continues to move from the center toward the upper right corner, the signal ramps back up and peaks in the vicinity of the interdigitated fingers and thereafter proceeds to ramp down as the finger reaches the upper right corner and goes beyond. As seen by the example, the shorter length and shorter spacing electrode fingers results in a smaller signal which contains the activation field to a smaller region that does not interfere with nearby switches, whereas the longer length and longer spacing electrode fingers provides a greater signal with a greater area of coverage sufficient to cover the large sensing pad as shown on the upper right side.

Figure 8:
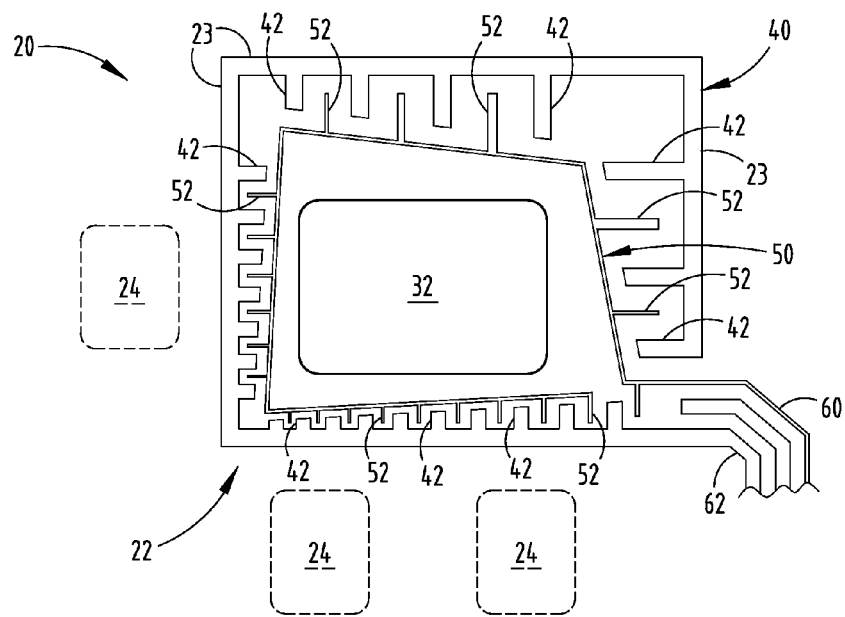
FIG. 8 is a front view of a lamp and switch assembly having an alternative proximity switch arrangement, according to another embodiment.

Referring to FIG. 8, a lamp and switch assembly 20 is illustrated having the switch 22 and sensor 23 configured in an alternative configuration, according to a second embodiment. In this embodiment, sensor 23 includes the outer electrode 40 and inner electrode 50 configured with interdigitated electrode fingers 42 and 52, respectively having a length and spacing therebetween that varies linearly along each side of the lamp lens 32 or sensing pad. Starting in the bottom left corner of the sensor 22, the electrode fingers 42 and 52 increase in length and in spacing therebetween in the direction toward the right side below lens 32 and from the bottom to the top on the left side of lens 32. The electrode fingers 42 and 52 likewise increase in length from the upper left side to the right side above lens 32 and from the bottom right side to the top right side on the right side of lens 32. The change in length and spacing between the interdigitated electrode fingers 42 and 52 is shown as continuously increasing in size along each side of the lens 32. However, it should be appreciated that the variations in length and spacing between electrode fingers 42 and 52 may otherwise be configured, according to other embodiments.

Accordingly, a proximity switch 22 is provided which has a plurality of interdigitated electrode fingers having different lengths and spacings so as to configure the activation field to prevent interference with nearby switches or sensors. The difference in length and spacing between the interdigitated electrode fingers is particularly useful for a large sensing pad, such as when utilized as a sensor or switch for activating a lamp that is integrally built into the lamp assembly. However, it should be appreciated that the proximity switch 22 may be employed for other switches, particularly for larger switches which have neighboring switches or sensors nearby that could cause potential interference.

It is to be understood that variations and modifications can be made on the aforementioned structure without departing from the concepts of the present invention, and further it is to be understood that such concepts are intended to be covered by the following claims unless these claims by their language expressly state otherwise.

We claim:

1. A proximity switch comprising:
a sensing pad; and
a proximity sensor disposed near a perimeter of the sensing pad and generating an activation field proximate to the sensing pad, said proximity sensor comprising first electrode fingers having multiple lengths interdigitated with second electrode fingers having multiple lengths, wherein differing spacings exist between adjacent first and second electrode fingers.

2. The proximity switch of claim 1, wherein the first and second electrode fingers are electrically coupled to generate the activation field.

3. The proximity switch of claim 2, wherein the first and second electrode fingers extends on first and second sides of the sensing pad, wherein the first and second electrode fingers on the first side of the sensing pad have a first length and a first spacing between adjacent electrode fingers and the first and second electrode fingers on the second side of the sensing pad have a second length and a second spacing between adjacent electrode fingers, wherein the second length is greater than the first length and the second spacing is greater than the first spacing.

4. The proximity switch of claim 3, wherein the first side is opposite the second side.

5. The proximity switch of claim 1, wherein the first and second electrode fingers extend from one end of one side to an opposite end, wherein the first and second electrode fingers on said one end have a first length and a first spacing between adjacent electrode fingers and the first and second electrode fingers on the opposite end have a second length and a second spacing between adjacent electrode fingers, wherein the second length is greater than the first length and the second spacing is greater than the first spacing.

6. The proximity switch of claim 1, wherein the proximity sensor substantially surrounds the perimeter of the sensing pad.

7. The proximity switch of claim 1, wherein the proximity switch is employed on a vehicle.

8. The proximity switch of claim 1, wherein the proximity sensor comprises a capacitive sensor.

9. The proximity switch of claim 1, wherein the switch is provided as an assembly comprising a lens having a transparent window and a light source disposed to illuminate light through the transparent window of the lens, wherein the transparent window comprises the sensing pad.

10. A proximity switch comprising:
a sensing pad; and
a proximity sensor disposed substantially around a perimeter of the sensing pad and comprising inner electrode fingers interdigitated and electrically coupled to outer electrode fingers to generate an activation field proximate to the sensing pad, wherein the inner and outer electrode fingers each have different lengths and different spacings exist between adjacent electrode fingers on one side of the sensing pad as compared to another side of the sensing pad.

11. The proximity switch of claim 10, wherein the proximity switch comprises a capacitive sensor and the activation field comprises a capacitive field.

12. The proximity switch of claim 10, wherein the inner and outer electrode fingers on one side of the sensing pad have a first length and a first spacing therebetween and the inner and outer electrode fingers proximate to another side of the sensing pad have a second length and a second spacing therebetween, wherein the second length is greater than the first length and the second spacing is greater than the first spacing.

13. A lamp and proximity switch assembly comprising:
a lens having a transparent window;
a light source disposed to illuminate light through the transparent window of the lens; and
a proximity sensor disposed substantially around a perimeter of the transparent window and generating an activation field proximate to the transparent window, said proximity sensor comprising a plurality of interdigitated electrode fingers having differing lengths and spacings between adjacent electrode fingers.

14. The assembly of claim 13, wherein the plurality of interdigitated electrode fingers comprises first electrode fingers and second electrode fingers, wherein the first and second electrode fingers are interdigitated and electrically coupled to generate the activation field.

15. The assembly of claim 14, wherein the plurality of interdigitated electrode fingers extends on first and second sides of the sensing pad, wherein the first and second electrode fingers on the first side of the sensing pad have a first length and a first spacing and the first and second electrode fingers on the second side of the sensing pad have a second length and a second spacing, wherein the second length is greater than the first length and the second spacing is greater than the first spacing.

16. The assembly of claim 15, wherein the first side is opposite the second side.

17. The assembly of claim 13, wherein the plurality of interdigitated electrode fingers extend from one end of one side to an opposite end, wherein the electrode fingers on said one end have a first length and a first spacing and the electrode fingers on the opposite end have a second length and a second spacing, wherein the second length is greater than the first length and the second spacing is greater than the first spacing.

18. The assembly of claim 13, wherein the proximity sensor substantially surrounds the perimeter of the transparent window.

19. The assembly of claim 13, wherein the assembly is employed on a vehicle.

20. The assembly of claim 13, wherein the proximity sensor comprises a capacitive sensor.

* * * * *